(12) United States Patent
Schoch

(10) Patent No.: US 6,876,175 B2
(45) Date of Patent: Apr. 5, 2005

(54) METHODS FOR DETERMINING THE CHARGE STATE AND/OR THE POWER CAPACITY OF CHARGE STORE

(75) Inventor: Eberhard Schoch, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/363,116

(22) PCT Filed: Jun. 6, 2002

(86) PCT No.: PCT/DE02/02053

§ 371 (c)(1),
(2), (4) Date: Jun. 23, 2003

(87) PCT Pub. No.: WO03/005052

PCT Pub. Date: Jan. 16, 2003

(65) Prior Publication Data

US 2004/0032264 A1 Feb. 19, 2004

(30) Foreign Application Priority Data

Jun. 29, 2001 (DE) .......................................... 101 31 297
Jan. 31, 2002 (DE) .......................................... 102 13 810

(51) Int. Cl.⁷ ........................ H01M 10/44; H01M 10/46
(52) U.S. Cl. ...................................................... 320/132
(58) Field of Search ................................ 320/132, 137, 320/149, 150; 324/426, 430, 433

(56) References Cited

U.S. PATENT DOCUMENTS 5,629,604 A * 5/1997 Sengupta et al. ........... 320/145
5,825,218 A 10/1998 Colli et al.
5,883,497 A 3/1999 Turnbull

FOREIGN PATENT DOCUMENTS

DE 198 47 648 4/2000
DE 199 59 019 6/2001
DE 100 56 969 5/2002

* cited by examiner

Primary Examiner—Edward H. Tso
(74) Attorney, Agent, or Firm—Kenyon & Kenyon

(57) ABSTRACT

Methods are described for determining the state of charge and/or the operability of a charge accumulator using estimates. The information, which is obtained at a least two different operating points or operating conditions of the energy accumulator, is taken into account in the estimates. The estimates are carried out with regard to an instantaneous and/or future state of charge and/or an instantaneous and/or future operability of the charge accumulator. Different methods are executed, depending on the operating point or operating condition. The methods may be run in a processor of a control unit.

13 Claims, 1 Drawing Sheet

METHODS FOR DETERMINING THE CHARGE STATE AND/OR THE POWER CAPACITY OF CHARGE STORE

BACKGROUND INFORMATION

Different methods for determining the state of charge and operability of electric energy accumulators, in particular lead acid batteries customary in the automatic industry, are known from the related art. In most of the methods, the state of charge of lead acid batteries is determined from the open-circuit voltage measured in the idling state, since the open-circuit voltage is proportional to the acid density in a broad range of states of charge (open-circuit voltage method). For the purpose of estimating the operability or load capacity of the energy accumulator with regard to a predetermined current consumption or power consumption, the internal resistance, which in starter batteries is ideally computed from the difference between the measured voltage values divided by the difference between the measured current values during the high current load at engine start, is needed in addition to the open-circuit voltage or the state of charge. A method used for determining the battery charge in that manner is known from German Published Patent Application No. 198 47 648 for example.

Continuous information and the state of charge and the operability of energy accumulators is required when safety-critical electrical consumers are used in motor vehicles, e.g., steer-by-wire or brake-by-wire systems, but also for battery systems and consumer management systems, so that the open-circuit voltage and the state of charge must also be determined during charging and/or discharging phases, and the internal resistance also without high current load. For this purpose, the state of charge is mostly extrapolated via the current integral using charge balancing and the internal resistance is mostly extrapolated via fixed predefined characteristic curves as a function of state of charge and battery temperature. However, during extended operation of the energy accumulator without idle phases or high current load, as well as due to the aging effects not taken into account in the characteristic curves, this method results in errors in the estimation of the state of charge and operability.

To prevent these errors, the related art describes model-based estimation methods which constantly adjust the state variables and parameters of a mathematical model of the energy accumulator to the real state variables and parameters by continuously measuring voltage, current, and temperature. Such model-based estimation methods are known from German Published Patent Application No. 199 59 019 for example. In the known methods, state of charge and operability of the energy accumulator are calculated from state variables and parameters so determined. The disadvantage of these methods is the fact that in order to cover the entire operating range of the energy accumulator with regard to discharging-/charging current range, state of charge, temperature, as well as aging effects, a complex, and as a rule non-linear, model of the energy accumulator is required, having many state variables and parameters to be estimated and which may only be analyzed at a great expense.

Alternatively simpler models covering only individuals operating points of the battery, e.g., only the discharging operation, have advantages; however, they allow an accurate determination of state of charge and operability only at these operating points. Such simple models are described in German Published Patent Application No. 100 56 969 for example.

SUMMARY OF THE INVENTION

An object of the present invention is to make the most accurate determination of the state of charge and the operability of a charge accumulator possible over a large operating range without great expense. By using a weighted correction of the state variables and parameters estimated from at least two methods that are active at two different operating points via continuous measurement of voltage, current, and temperature, the method according to the present invention makes a more accurate estimation of the current and future state of charge and operability of the energy accumulator, in particular a motor vehicle lead battery, possible over a large operating range compared to the individual methods.

The method according to the present invention combines the advantage of the open-circuit voltage methods, i.e., the accurate determination of the open-circuit voltage, i.e., the state of charge in phases of the battery without load and the internal resistance at high current load (e.g., engine start), and the advantage of simple model-based estimation methods using which open-circuit voltage and internal resistance, as well as other optional state variables and parameters may be estimated, even during operation without idling or high current loads, thereby, compared to the individual methods, enabling a more accurate determination of the state of charge and the operability of the battery over a large operating range without complex battery models.

For calculating the state of change and the operability, the minimum required variables open-circuit voltage and internal assistance, as well as other optional state variables and parameters, are calculated in an advantageous manner from the values of the individual methods by weighted correction, their weighting being selected according to their reliability at the current operating point of the battery.

Predictions of the future operability are possible via extrapolation of the currently estimated state variables and parameters for state of charge and temperature to a later point in time, so that, the example, the capability of the battery to start a vehicle parked for several days may also be estimated.

DETAILED DESCRIPTION

Figure 1:
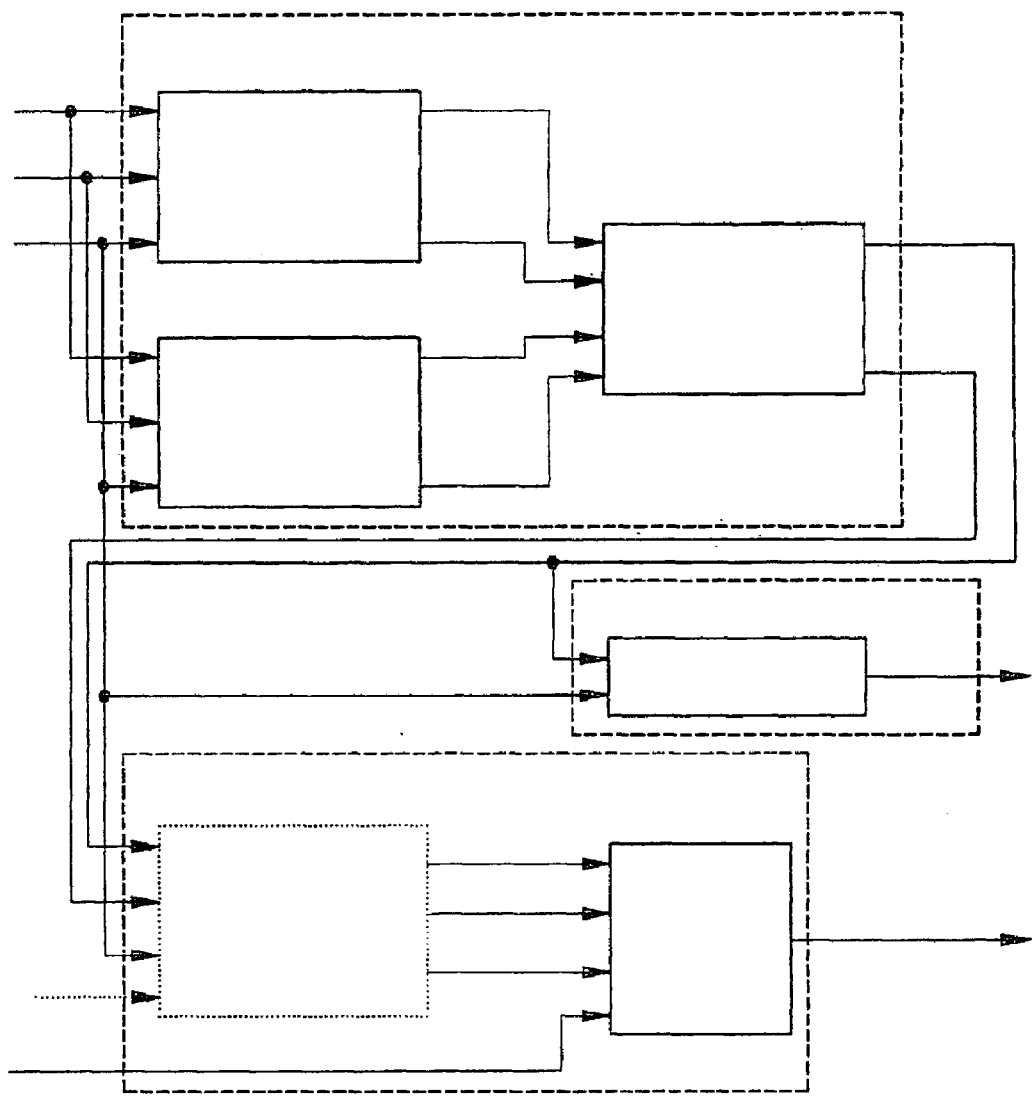
FIG. 1 shows a battery state detection system according to the present invention.

FIG. 1 shows the basic structure of the battery state detection system using two state estimation and parameter estimation methods active at two different operating points of the battery. The number of the methods used is not necessarily limited to two; however, at least one method is model-based, i.e., the state variables and parameters of a battery model are adapted to the real values, e.g., via a recursive least-square estimator, e.g., an extended Kalman filter.

State variables $\underline{z}$(e.g., open-circuit voltage $U_{00}$) and parameters $\underline{p}$(e.g., internal resistance $R_i$) required for determining the state of charge and the operability of the battery are obtained from continuous measurement of battery voltage $U_{Batt}$, battery current $I_{Batt}$, and battery temperature $T_{Batt}$ by the state and parameter estimating system. The state of charge calculation determines state of charge soc from vector $\underline{z}$ of the state variables and from the instantaneous battery temperature $T_{Batt}$, while the instantaneous operability of the battery is estimated via voltage response $U_{Batt,pred}$ (t) of a battery model initialized using state vector $\underline{z}$ and parameter vector $\underline{p}$ to a predefined load current profile $I_{Load}(t)$.

If the operability of the battery at a future point in time is of interest, e.g., the starting capability is queried after the vehicle was parked for several days, then instantaneous variables $\underline{z}$ and parameters $\underline{p}$, as well as instantaneous battery temperature $T_{Batt}$ are extrapolated to values $\underline{z}'$, $\underline{p}'$, and $T_{Batt}'$ to be expected at the future point in time. In order to pre-estimate the reduction in the state of charge as a function of the parking time of the vehicle, the variation of closed-circuit current $I_{Rest}(t)$ in the parked vehicle must be known.

Using method A, here referred to as open-circuit voltage method, open-circuit voltage $U_{00}$ is determined during no-load phases of the battery and internal resistance $R_1$ of the battery is determined during a high current load (e.g., engine start). In addition, further variables, e.g., (acid) capacity $Q_0$ may be derived from measured variables current $I_{Batt}$, voltage $U_{Batt}$, and temperature $T_{Batt}$, or calculated variables $U_{00}$ and $R_i$. The state variables determined by method A are combined in state vector $\underline{z}_A$, and the parameters are combined in vector $\underline{p}_A$. Method B is model-based and also estimates at least open-circuit voltage $U_{00}$ and internal resistance $R_i$, however, compared to method A, also in other or additional operating stages of the battery (e.g., discharge). The state variables determined by method B are combined in state vector $\underline{z}_B$, and the parameters are combined in vector $\underline{p}_B$.

In each calculation step k, state vector $\underline{z}_{k+1}$ is calculated by using weighted differences $\underline{z}_{A,K}-\underline{z}_k$, $\underline{z}_{B,k}-\underline{z}_k$ and parameter vector $\underline{p}_{k+1}$ is calculated by using weighted differences $\underline{p}_{A,k}-\underline{p}_k$, $\underline{p}_{B,k}-\underline{p}_k$ starting with starting values $\underline{z}_{k=0}=\underline{z}_0$ and $\underline{p}_{k=0}=\underline{p}_0$:

$$\underline{z}_{k+1}=\underline{z}_k+\underline{G}_{z,A}*(\underline{z}_{A,k}-\underline{z}_k)+\underline{G}_{z,B}*(\underline{z}_{B,k}-\underline{z}_k)$$

$$\underline{p}_{k+1}=\underline{p}_k+\underline{G}_{p,A}*(\underline{p}_{A,k}-\underline{p}_k)+\underline{G}_{p,B}*(\underline{p}_{B,k}-\underline{p}_k)$$

Weighting matrixes $\underline{G}_{z,A}$, $\underline{G}_{z,B}$, $\underline{G}_{p,A}$, and $\underline{G}_{p,B}$ are square diagonal matrixes whose main diagonal elements $g_{z,A,i=1\ldots n}$, $g_{z,B,i=1\ldots n}$, $g_{p,A,j=1\ldots m}$, $g_{p,B,j=1\ldots m}$ specify the degree of correction of the n state variables and the m parameters and must fulfill the following requirements, so that the sequences $\underline{z}_{k=0}, \underline{z}_{k=1}, \underline{z}_{k=2} \ldots$ and $\underline{p}_{k=0}, \underline{p}_{k=1}, \underline{p}_{k=2} \ldots$ converge:

$$g_{z,A,i}+g_{z,B,i} \leq 1, i=1 \ldots n$$

$$g_{p,A,j}+g_{p,B,j} \leq 1, j=1 \ldots m$$

The weightings are selected in such a way that state variables and parameters which at the instantaneous operating point are more accurately determined by using one method than the other, contribute more to the correction. For example, the estimated variables of the model-based method may flow into the correction only when the estimating algorithm has become stable, when the estimated variables are uniquely identifiable (observability), and when the battery operates at points which are also described by the underlying model (e.g., discharge). In all other cases the corresponding weightings must be set $g_{z,B,i}$ and $g_{p,Bj}=0$.

An example of a particular variant of an embodiment of the battery state of charge detection for predicting the operability of lead batteries in motor vehicles is described in the following:

Predictor Model

Figure 2:
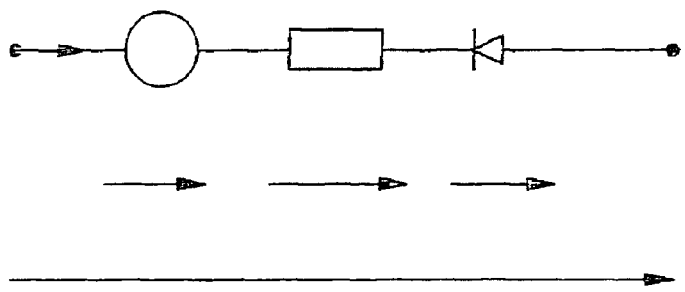
FIG. 2 shows a predictor model.

For estimating the operability of a lead battery under short-time load (on the order of 10 sec) using currents on the order of $I_{Load} \leq -100A$ (counting direction I<0A for discharge) as it typically occurs, e.g., in the operation of electric braking and steering systems, as well as at engine start in motor vehicles. The following simple predictor model, illustrated in FIG. 2, may be used.

Using the equivalent diagram components:

$I_{Load}$=predefined current for which operability is to be tested $U_{00}$=open-circuit voltage $R_i$=ohmic internal resistance Diode=non-linear resistance of the crossover polarization $U_{Ohm}=R_i*I_{Load}$=ohmic voltage drop at predefined current profile $I_{Load}$ $U_D=f(I_{Load}, T_{batt})$=characteristic curve of the stationary crossover voltage drop at predefined current profile $I_{Load}$ and battery temperature $T_{batt}$ Formula determined from measurements:

$$U_D(I_{Load}, U_{D0})=U_{D0}*ln(I_{Load}/(-1A)), I_{Load}<0A$$

using the temperature-dependent crossover parameter:

$$U_{D0}(T_{Batt})=4.97e-7*(T_{Batt}/°C.)^3-4.87e-5*(T_{Batt}/°C.)^2+1.82e-3*(T_{Batt}/°C.) \ldots -131e-1$$

$U_{Batt,pred}=U_{00}+R_i*I_{Load}+U_D(I_{Load}, U_{D0})$=predicted voltage response for battery current $I_{Load}$ The following prerequisites must be met for the applicability of the predictor model:

the discharge due to the predefined load profile $I_{Load}(t)$ is negligible compared to the battery capacity, i.e., open-circuit voltage $U_{00}$ may be assumed to be constant, during the load with $L_{Load}(t)$, the crossover voltage becomes stabilized at its steady-state final value predefined by characteristic curve $U_D=f(I_{Load}, T_{batt})$, i.e., the load is applied sufficiently long and is sufficiently high (time constant of $U_D \sim 1/I_{Load}$), the concentration overvoltage, not considered in the mode, which is caused by acid density differences in the battery, is negligible, charges which are possibly stored in additional capacitances (e.g., double layer capacitance between electrodes and electrolyte) outside the actual battery capacity are not considered (worst case scenario).

These prerequisites are met for the described load in the state of charge range of soc>approximately 30% and for battery temperatures of $T_{Batt}$>approximately 0° C., as well as soc>approximately 50% and $T_{Batt}$>approximately 0° C.

State variables and parameters are determined on the basis of the following considerations:

State variable $U_{00}$, as well as parameters $R_i$ and $U_{D0}$ of the predictor model, are determined by using two different methods:

Method A determines $U_{00,A}$ from measurements of the idling voltage an unloaded battery and $R_{i,A}$ by analyzing the quotient of differences of the voltage and current values measured at engine start, while crossover parameter $U_{D0,A}$ is not estimated by method A but rather calculated via the above-mentioned characteristic curve.

In addition, method A determines the battery (acid) capacity from two open-circuit voltage determinations $U_{00,A1}$ and $U_{00,A2}$, as well as the current integral (charge balance)q=$\int I_{Batt}(t)dt$:

$$Q_{0,A}=q*(U_{00,max}(25°C.)-U_{00,min}(25°C.)/(U_{00,A,2}(25°C.)-U_{00,A,1}(25°C.)$$

where $U_{00,max}$=open-circuit voltage of the fully charged battery and $U_{00,min}$=open-circuit voltage of the empty battery at $T_{Batt}$=25° C.

Using $Q_{0,A}$, current charge balance $q_k$, and current battery temperature $T_{Batt,k}$, method A tracks open-circuit voltage $U_{D0,0}$, determined during the idle phase, during operation in each time step k:

$$U_{00,A,k}(25°\text{C.})=U_{00,A,0}(25°\text{C.})+q_k/Q_{0,A}*(U_{00,max}(25°\text{C.})-U_{00,min}(25°\text{C.})$$

$$U_{00,A,k}=U_{00,A,k}(25°\text{C.})+Tk_{U00}*(T_{Batt,k}-25°\text{C.}), Tk_{U00}=1.38e-6V/°\text{C.}$$

Internal resistance $R_{i,A,0}$, determined at the start, is tracked in a similar manner during operation via a characteristic curve as a function of current open-circuit voltage $U_{00,A,k}$ and instantaneously measured battery temperature $T_{Batt,k}$:

$$R_{i,k}=f(R_{i,A,0},U_{00,A,k},T_{Batt,k})$$

By adjusting a suitable battery model in discharge range ($I_{Batt}<0A$), method B estimates open-circuit voltage $U_{00,B}$, internal resistance $R_{i,B}$, as well as crossover parameter $U_{D0,B}$, and battery capacity $Q_{0,B}$. The variables needed for determining the state of charge and operability are calculated from the state variables and parameters determined by methods A and B using a weighted correction; a constant sampling rate of 0.01 sec has been assumed for the individual time steps.

$$U_{00,k+1}=U_{00,k}+g_{U00,A}*(U_{00,A,k}-U_{00,k})+g_{U00,B}*(U_{00,B,k}-U_{00,k})$$

where $$U_{00,0}=U_{00,A,0},\ g_{U00,A}=1-|q_k|/Q_0,\ g_{U00,B}=|q_k|/Q_0$$

i.e., with an increasing absolute value of charge balance $|q_k|$, starting value $U_{00,0}=U_{00,A,0}$ determined by method A from an idle phase is corrected to an increasing degree by value $U_{00,B,k}$ determining by method B during vehicle operation.

$$R_{i,k+1}=R_{i,k}+g_{Ri,A}*(R_{i,A,k}-R_{i,k})+g_{Ri,B}*(R_{i,B,k}-R_{i,k})$$

where $$R_{i,0}=R_{i,A,0},\ g_{Ri,A}=0,\ g_{Ri,B}=1.e-3$$

i.e., starting value $R_{i,0}=R_{i,A,0}$ determined by method A at engine start is corrected during vehicle operation to value $R_{i,B,k}$ determined by method B using constant weighting $g_{Ri,B}=1.e-3$.

$$U_{D0,k+1}=U_{D0,k}+g_{UD0,A}*(U_{D0,A,k}-U_{D0,k})+g_{UD0,B}*(U_{D0,B,k}-U_{D0,k})$$

where $$U_{D0,0}=U_{D0,A,0},\ g_{UD0,A}=0,\ g_{UD0,B}=1.e-3$$

i.e., crossover parameter $U_{D0,A}$ predefined by method A via characteristic curve $U_{D0}(T_{Batt})$ is corrected to value $U_{D0,B,k}$ estimated by method B during vehicle operation using constant weighting $g_{UD0,B}=1.e-3$.

Capacity $Q_0$ is not really needed for the prediction of operability; however, value $Q_{0,A,0}$ determined from idle phases by method A may be improved by values $Q_{0,B,k}$ estimated by method B during vehicle operation. Since the accuracy of $Q_{0,B,k}$ increases with increasing absolute value of charge balance $|q_k|$, the weighting was selected proportional to this value $$Q_{0,k+1}=Q_{0,k}+g_{Q0,A}*(Q_{0,A,k}-Q_{0,k})+g_{Q0,B}*(Q_{0,B,k}-Q_{0,k})$$

where $$Q_{0,0}=Q_{0,A,0},\ g_{Q0,A}=0,\ g_{Q0,B}=5.e-4*|q_k|/Q_{0,k}$$

Calculation of the Instantaneous State of Charge:

Relative state of charge soc is calculated from instantaneously determined open-circuit voltage $U_{00}$ (state variable) and instantaneous battery temperature $T_{Batt}$ (measured variable):

$$soc=(U_{00}(25°\text{C.})-U_{00,min}(25°\text{C.}))/(U_{00,max}(25°\text{C.})-U_{00,min}(25°\text{C.}))$$

where $$U_{00}(25°\text{C.})=U_{00}-Tk_{U00}*(T_{Batt}-25°\text{C.}),\ Tk_{U00}=1.38e-6V/°\text{C.}\ U_{00,max}(25°\text{C.})=$$

maximum value of the open-circuit voltage at room temperature and fully charged battery $U_{00,min}(25°\text{C.})=$ minimum value of the open-circuit voltage at room temperature and empty battery (after removal of charge $Q_0$).

Calculation of the Instantaneous Operability

The instantaneous operability is determined by battery voltage $U_{Batt,pred}$ under predefined load current $I_{Load}$ calculated by using the predictor model, and the instantaneously estimated state variables and parameters ($U_{00}$, $R_i$, $U_{D0}$):

$$U_{Batt,pred}=U_{00}+R_i*I_{Load}+U_D(I_{Load},U_{D0})$$

As the absolute measure for the operability of the energy accumulator (SOH=State of Health), the distance of the minimum value of the predicted battery voltage to a lower limit voltage $U_{Batt,limit}$ at which the energy accumulator just about generates the power required for the considered user (e.g., electric steering and brake systems, starter, . . . ) may be used:

$$SOH_{abs}=min(U_{Batt,pred})-U_{Batt,limit}$$

The relative measure is obtained by relating $SOH_{abs}$ to the difference obtained in the most favorable case, i.e., for a new, fully charged battery and at high temperatures:

$$SOH_{rel}=(minU_{batt,pred}-U_{batt,limit})/(U_{Batt,pred,max}-U_{batt,limit})$$

Calculation of Future Operability

Future operability may be estimated by inserting the state variables ($U_{00}'$) and parameters ($R_i'$, $U_{D0}'$), extrapolated to the future point in time with regard to battery temperature and state of charge, into the prediction equation. Temperature $T_{Batt}'$ to be expected may be determined by averaging the battery temperatures over the previous 10 to 14 days. For worst case scenarios, 10K are once more subtracted from this value.

Open-circuit voltage $U_{00}'$ to be expected after x days of parking of the vehicle is determined via the drop in the state of charge based on the discharge due to closed-circuit current $I_{Rest}$:

$$U_{00}(25°\text{C.})'=U_{00}(25°\text{C.})+I_{Rest}*x*24h/Q_0*(U_{00,max}(25°\text{C.})-U_{00,min}(25°\text{C.}))$$

$$U_{00}'=U_{00}(25°\text{C.})'+Tk_{U00}*(T_{Batt}'-25°\text{C.}),Tk_{U00}=1.38e-6V/°\text{C.}$$

Internal resistance $R_i'$ is extrapolated by using characteristic curve $R_i'=f(R_i,U_{00}',T_{Batt}')$, while crossover parameter $U_{D0}'$ is calculated via characteristic curve $U_{D0}(T_{Batt}')$.

What is claimed is:

1. A method for determining at least one of a state of charge and an operability of a charge accumulator in accordance with an estimate, comprising:

taking into account in the estimate information obtained at at least two different operating points of the charge accumulator;

executing at least an open-circuit voltage operation and a model-based estimation operation; and determining the state of charge in accordance with information obtained in each of the open-circuit voltage operation and the model-based estimation operation.

2. The method as recited in claim 1, further comprising:

forming a weightable correction variable from the information.

3. A method for determining at least one of a state of charge and an operability of a charge accumulator in accordance with an estimate, comprising:

taking into account in the estimate information obtained at at least two different operating points of the charge accumulator; and performing an estimation in accordance with at least one of:
  at least one of an instantaneous state of charge and a future state of charge, and
  at least one of an instantaneous operability of the charge accumulated and a future operability of the charge accumulator.

4. The method as recited in claim 2, further comprising:

operating a predictor to perform an estimation in accordance with at least one of a future state of charge of the charge accumulator and a future operability of the charge accumulator.

5. The method as recited in claim 1, wherein:

two operating states include an idle state of the charge accumulator and an active state of the charge accumulator.

6. The method as recited in claim 1, further comprising:

forming a mathematical model that is processable in accordance with a predefinable variable.

7. A method for determining at least one of a state of charge and an operability of a charge accumulator in accordance with an estimate, comprising:

taking into account in the estimate information obtained at at least two different operating points of the charge accumulator; and implementing a state estimate and a parameter estimate;

wherein an open-circuit voltage operation and a model-based estimation operation are used for the state estimate and the parameter estimate.

8. A method for determining at least one of a state of charge and an operability of a charge accumulator in accordance with an estimate, comprising:

determining a state variable and a state parameter from the following measured variables:
  a battery voltage,
  a battery current, and
  a battery temperature according to a first operation;

determining an additional state variable and an additional sate parameter according to a second, model-based operation;

obtaining a correction variable from at least one of the state variable, the additional state variable, the state parameter, and the additional state parameter;

calculating the state of charge in accordance with at least one of the state variable and the additional state vehicle; and predicting the operability of the charge accumulator and determining the battery voltage in accordance with at least one of the state variable and the additional state variable and at least one of the state parameter and the additional state parameter.

9. The method as recited in claim 8, wherein:

the first operation includes an open-circuit voltage operation.

10. A device for determining at least one of a state of charge and an operability of a charge accumulator in accordance with an estimate, comprising:

an arrangement for taking into account in the estimate information obtained at at least two different operating points of the charge accumulator to perform at least an open-circuit voltage operation and a model-based estimation operation, and to determine the state of charge in accordance with information obtained in each of the open-circuit voltage operation and the model-based estimation operation.

11. The device as recited in claim 10, further comprising:

an arrangement for estimating a state variable and a state parameter;

an arrangement for calculating the state of charge; and an arrangement for predicting the operability, wherein:
  the arrangement for estimating, the arrangement for calculating, and the arrangement for predicting are connected to one another.

12. A device for determining at least one of a state of charge and an operability of a charge accumulator in accordance with an estimate, comprising:

a determining arrangement to determine a state variable and a state parameter from at least one of a battery voltage, a battery current, and a battery temperature according to a first operation, and to determine an additional state variable and an additional state parameter according to a second, model-based operation;

an obtaining arrangement to obtain a correction variable from at least one of the state variable, the additional state variable, the state parameter, and the additional state parameter;

a determining and predicting arrangement to determine the state of charge in accordance with at least one of the state variable and the additional state variable, to predict the operability of the charge accumulator, and to determine the battery voltage in accordance with at least one of the state variable and the additional state variable and at least one of the state parameter and the additional state parameter.

13. The device as recited in claim 12, wherein the first operation includes an open-circuit voltage operation.

* * * * *

UNITED STATES PATENT AND TRADEMARK OFFICE
CERTIFICATE OF CORRECTION

PATENT NO.         : 6,876,175 B2
APPLICATION NO. : 10/363116
DATED                 : April 5, 2005
INVENTOR(S)       : Eberhard Schoch It is certified that error appears in the above-identified patent and that said Letters Patent is hereby corrected as shown below:

On the title of the patent, item (57) Abstract, line 3, change "at a least two" to --at at least two--

Column 1, line 10, change "in the automatic industry," to --in the automotive industry, --

Column 1, line 61, change "covering only individuals" to --covering only individual--

Column 2, line 59, change "$\underline{Z}$(e.g.," to --$\underline{z}$ (e.g.,--

Column 2, line 60, change "$\underline{P}$(e.g.," to --$\underline{p}$ (e.g.,--

Column 4, line 53, change "an unloaded battery" to --at unloaded battery--

Column 7, line 55, change "sate parameter" to --state parameter--

Column 8, line 3, change "vehicle; and" to --variable; and--

Signed and Sealed this

Seventeenth Day of April, 2007

JON W. DUDAS
*Director of the United States Patent and Trademark Office*